Dec. 17, 1968 N. G. MUSKOVAC 3,417,320

LOW NOISE CONTROL CIRCUIT

Filed March 31, 1966

United States Patent Office 3,417,320

Patented Dec. 17, 1968

3,417,320

LOW NOISE CONTROL CIRCUIT

Nicholas G. Muskovac, Williamstown, Mass., assignor to Sprague Electric Company, North Adams, Mass., a corporation of Massachusetts Filed Mar. 31, 1966, Ser. No. 539,022

13 Claims. (Cl. 323—22)

ABSTRACT OF THE DISCLOSURE

A gate pulse which leads the applied alternating current in phase is elongated or shortened to move its trailing end into or back out of conductive half-cycles of the AC for low noise triggering of a thyristor at the commencement of these half-cycles. A temperature sensitive element controls the temperature of the environment surrounding a heating element by shortening or elongating the gate pulse.

This invention relates to control circuits for solid state controlled rectifiers (hereinafter called thyristor) and more particularly to a low noise control circuit for thyristors.

Various control circuits which employ thyristors for switching large amounts of power are available in the prior art. These generally utilize the ability of the thyristor to conduct in response to a low voltage gate pulse when its anode is positively biased, and to continue such conduction until the positive anode bias is removed. One common difficulty, however, is the high power surges and multiple frequencies, or noise, generated by switching the thyristor "on" when a substantial positive anode bias exists.

One object of this invention is to provide a low noise thyristor control circuit which provides gate pulses only at the initiation of positive anode voltage.

Another object of this invention is to provide a low noise control circuit having a fast fall-time pulse which is variable with respect to the zero crossing of an applied alternating current.

A further object of this invention is to provide a very sensitive or high gain automatic control circuit which provides low noise control of current to an environment producing load in response to a predetermined value of the environment.

These and other objects of the invention will be apparent from a consideration of the following description taken in conjunction with the drawing, in which.

Basically, a low noise circuit for firing thyristors comprises means providing a gate pulse leading the applied alternating current in phase, and means for moving the trailing edge of the pulse in and out of half-cycles having a similiar polarity to the pulse for triggering of the thyristor only at the commencement of the half-cycle.

In a more limited sense, a low noise thyristor firing circuit produced in accordance with the invention provides a phase shifting network in connection to the input of a square-loop core transformer and an alternating current source such that fast fall-time pulses of alternating polarity are provided at the transformer output and conducted to the gates of a pair of alternately polarized thyristors. Means are provided to vary the occurrence of the pulse trailing edge with respect to the zero crossing of the applied alternating current thereby controlling the firing of the thyristors at the commencement of conductive half-cycles of anode voltage.

The phase shift network produces a phase leading voltage across the transformer primary such that pulses from the transformer occur at, or slightly leading, the commencement of the conductive half-cycle of the thyristor anode voltage source. Thereafter, by slightly varying the phase or amplitude of the primary voltage, the steep trailing edge of the pulse may be moved into or back out of phase with the conductive half-cycle to provide positive gate bias only at the commencement of the half-cycle.

Since substantially maximum gate bias is provided at the commencement of conductive half-cycles, the thyristor is turned on smoothly from zero voltage and low noise control of the thryistors is maintained. The steep trailing edge of the pulse provides low noise firing with thyristors having different impedances, since the amplitude of the pulse is at all times sufficient to fire the device. Thus, all that is necessary is to move the trailing edge of the pulse within the half-cycle of positive anode bias.

Although this shifting of the pulse fall, or trailing edge, may be accomplished by changing the pulse phase angle such as by varying one of the phase determining components, a change in pulse length is utilized in the preferred embodiment. The latter is provided by an amplitude variation of the voltage input to either the phase shifter or the transformer primary.

In addition to the indicated on-off control, proportional control may also be provided in accordance with the invention by a cycling of the pulse phase angle or the pulse length thereby reducing the average power to the load.

Figure 1:
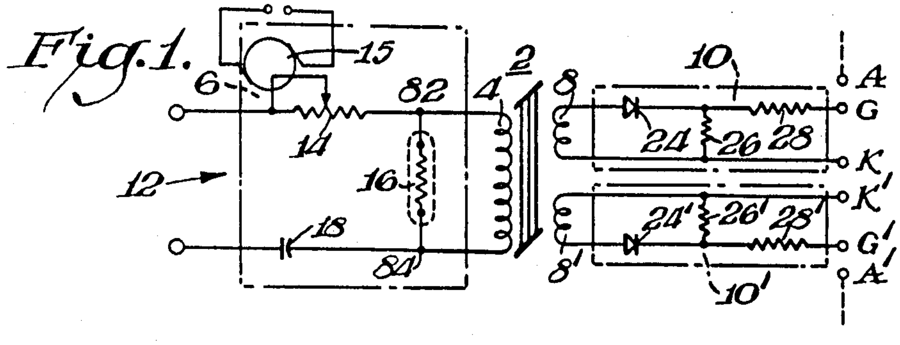
FIGURE 1 is a schematic diagram of a low noise control circuit for full wave firing of a pair of thyristors.

Referring now to the figures, and to FIGURE 1 in particular wherein is shown a square-loop core transformer 2 having an input winding 4 in connection to a phase shift network 6, and output windings 8, 8' in connection to a pair of gate circuits 10, 10'. The phase shift network 6, which is driven from an AC source 12, includes a potentiometer 14, a sensor 16 and a capacitor 18. These components are adjusted in value to provide a slight lead in phase angle with respect to source 12. The primary winding 4 also effects the phase slightly, although for convenience its effect is presumed to be negligible in the following description. Sensor 16 may be any type of element which will vary the voltage across winding 4 in response to the environment to which the sensor is exposed. As explained in more detail in regard to FIGURE 5, sensor 16 may, for example, be a thermally sensitive device such as a positive temperature coefficient thermistor or the like.

Figure 2:
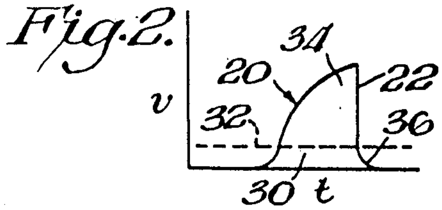
FIGURE 2 is a diagram of the output pulse obtained from the transformer of FIGURE 1.

Accordingly, an alternating signal, leading source 12 in phase, is applied across input windings 4 thereby inducing a voltage in output windings 8, 8'. Transformer 2, however, having a square-loop core and thus a generally rectangular hysteresis loop, magnetically saturates at a specific volt-second input, and during each half-cycle induces a narrow pulse of limited voltage amplitude and fast fall-time in output windings 8, 8'. Thus, as shown in FIGURE 2, a low voltage pulse 20 having a fast fall-time 22 is formed. In the thyristor art, a fast fall-time would be much faster than the AC rise time and generally is in the order of 46 microseconds which is one electrical degree at 60 hertz. A fast fall-time of this order is inherent in square core transformers, and a suitably fast fall-time of approximately 50 microseconds is obtained with the transformer given in the specific example.

Consequently pulse 20 or a portion of it is developed across terminals G, K and G', K'. The terminals G, K and G', K' being provided for connection to the gate and cathode respectively of inversely polarized thyristors (not shown in FIGURE 1). In this way a high sensitivity as well as low noise on-off thyristor control is provided, since at the trailing edge of the pulse the gate bias changes very rapidly from the maximum amplitude of the gate pulse to substantially zero. This is in contrast to prior art slow fall-time pulse circuits in which the gate bias varies gradually from maximum pulse amplitude to zero.

Accordingly, a pair of gate circuits 10, 10' which comprise diodes 24, 24' and resistors 26, 26' and 28, 28' connect the transformer output to the gate termi als. One side of windings 8, 8' is connected in each case, through diode 24, 24' and resistor 28, 28' respectively to terminals G, G' whereas the other side is connected directly to terminals K, K' respectively.

Diodes 24, 24' isolate transformer 2 from the thyristors and provide the correct polarity of pulse 20 to each, so that they are gate pulsed only at the commencement of conductive half-cycles of anode bias. Resistors 28, 28' are utilized to reduce the load on transformer 2, whereas resistors 26, 26' which shunt the serially connected diodes 24, 24' and windings 8, 8', provide a low impedance from terminal G to K and G' to K' to prevent self firing of the thyristor due to leakage current from anode to gate of the thyristor.

Diodes 24, 24' also provide a small voltage drop in gate circuits 10, 10' which removes the lower portion 30 of pulse 20 as illustrated in FIGURE 2. Thus, as indicated by line 32 of the latter figure, the lower portion 30 is clipped and only the upper portion 34 is developed across resistor 26, 26' and terminals G, K and G', K'. Consequently, the trigger or gate pulse 34 has a faster fall-time than that of pulse 20 since the tapered portion 36, where the pulse returns to zero voltage, is removed.

Accordingly, pulse 20 is developed in transformer 2 at the start of each half-cycle of alternating current applied to winding 4, however, these pulses 20 lead source 12 in accordance with the lead of the current in primary 4 as provided by the phase shift network 6.

Figure 3:
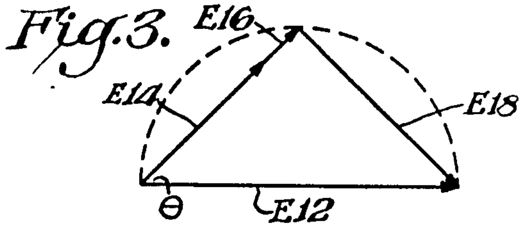
FIGURE 3 is a vector diagram depicting the voltage vectors of a phase shifting portion of the circuit of FIGURE 1.

Thus, as graphically illustrated in FIGURE 3, the voltage E14 of potentiometer 14, and E16 of resistive sensor 16 leads the source voltage by an angle $\theta$, of approximately 45°, while the voltage E18 of capacitor 18 lags the source. Since the voltage impressed across winding 4 is in phase with that of sensor 16, or E16, a saturation of transformer 2 and thus a pulse 20 will occur leading the phase of source 12 by the angle $\theta$. This angle is measured from the leading edge of the pulse to the zero crossing of the alternating voltage of source 12.

Consequently, by providing a pulse having a width slightly less than the leading phase angle $\theta$, the pulse fall will occur at, or just prior to, the zero crossing of alternating current as shown in FIGURE 4B. In this figure waveform A represents that of the alternating source 12, while wave forms B, C, D and E represent the pulse shape and phase of pulse 20 under various conditions.

Thus, for example, B represents pulses 20 having a phase angle $\theta$ which occurs when the phase shifter elements 14, 16 and 18 are adjusted to provide an out of phase pulse wholly within the inverse half-cycle such that the thyristor will be biased "off." Thus, gate pulses 20, as shown at B, are completed before the commencement of half-cycles of similar polarity. This can be appreciated by comparison to waveform 4A which represents the anode voltage, or source 12.

Waveform C is an example of a circuit condition in which pulse 20 has a phase angle of $\theta'$ and is shifted slightly towards the in-phase position so that the trailing edge is within a half-cycle of similar polarity. As expected, these pulses will provide a firing, or turning "on," of the thyristor since it will bias the gate-to-cathode positive during positive half-cycle of anode voltage. It provides low noise firing, of course, since the positive gate bias is provided at the commencement of the positive, or conductive, half-cycle of anode voltage.

As indicated the circuit has very high gain or high sensitivity since only a minor shift in the trailing edge position is required for on-off control. For example, a phase shift of only 1.2° is satisfactory if the pulse fall is made to occur at the commencement of the conductive half-cycle. The latter is provided by making the phase lead, which is measured from the start of the gate pulse to the zero crossing, of the voltage on winding 4 equal to the pulse width. A phase lead from 10° to 90° is suitable, however, the optimum angle was found to be 30° to 45°. The phase angle is of course a function of the phase shifter 6, while the pulse width is dependent upon the square-loop core and the number of turns in winding 4.

Advantageously the phase variation, shown in 4C, can be accomplished by varying the value of either potentiometer 14 or capacitor 18. To fire the thyristors (not shown in FIGURE 1), the resistivity of 14 can be increased thereby increasing vector E14 of FIGURE 3, or the capacitor 18 can be reduced thereby shortening vector E18 of this figure. Either will move pulse 20 into phase with the conductive half-cycle.

Figure 4:
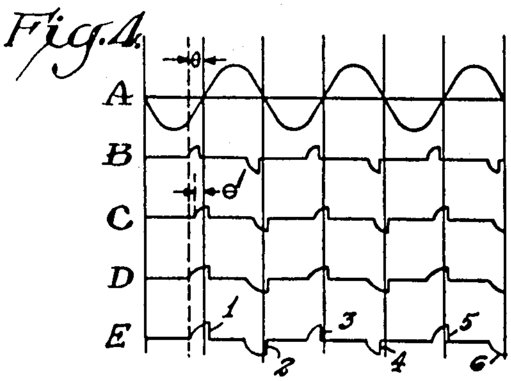
FIGURE 4 is a wave form analysis of the applied alternating current and gate pulses provided by the circuit of FIGURE 1.

Waveform D of FIGURE 4 is a further example of firing or "on" pulses. These pulses, which lead by the phase angle $\theta$, are not shifted in phase with respect to B but are elongated. Thus, the phase angle, or the start of each pulse (for all practical purposes) is the same as that of B, however, by lengthening the pulse its trailing edge is made to occur within a half-cycle of similar polarity, thereby firing the thyristors. Since the saturation of transformer 2 is a function of volt-seconds this elongation may be provided by a change in voltage amplitude, such as in the voltage across winding 4. Thus, increased voltage across winding 4 provides a shortened or narrow pulse whereas decreased voltage provides a widened or elongated pulse.

Figure 5:
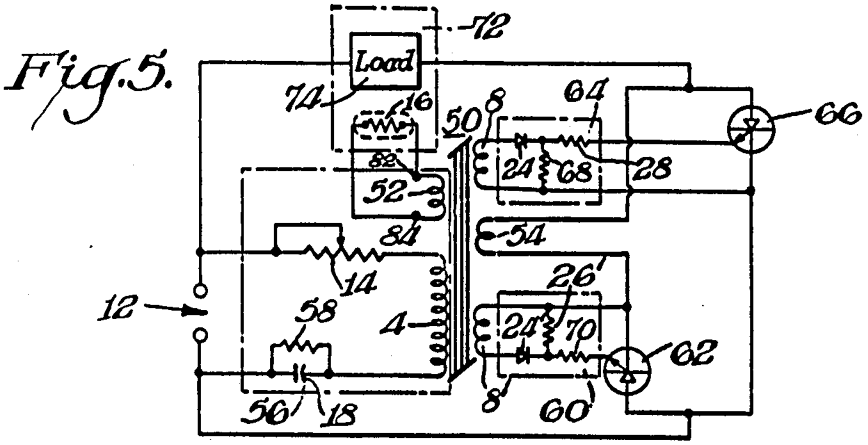
FIGURE 5 is a schematic diagram of a further modification of a low noise control circuit.

Consequently a change in the amplitude or phase of the voltage on winding 4 can be employed to move the pulse fall into a half-cycle of similar polarity. However, a variation in amplitude is preferred, since it is suitable for low voltage sensing devices. In this case, the sensor experiences only the voltage of winding 4, which is equal to the amplitude of pulse 20 and, thus, much less than that of source 12. A further advantage of this control is that sensor 16 may be entirely isolated from the AC source as shown in FIGURE 5.

Low noise proportional control is also provided in accordance with the invention by providing a phase or amplitude cycle of low rate, such as one cycle per second. For example, the phase shifting elements 14, 18, the voltage of primary 4 or the input to phase shifter 6 may be cycled. The phase angle of pulse 20 may be cycled, for example, and the pulse fall constantly shifting with respect to the zero crossing of the applied current by providing that potentiometer 14 be motor driven as for example by motor 15 which cycles the potentiometer by means of a cam drive or the like. A sinusoidal, triangular or sawtooth waveform or other ramp type waveform is suitable. Under these circumstances the pulses B, C and D of FIGURE 4 would not be stationary, as shown, but slightly alternating in phase. A similar phase cycle may also be accomplished by cycling capacitor 18.

Waveform E of FIGURE 4 is an example of phase cycling of the gate pulses. As illustrated, gate pulses $E_1$ and $E_2$ have been shifted in phase to have their trailing edge within their respective conductive half-cycles whereas gate pulses $E_3$ and $E_4$, which occur in the next full cycle of AC, have been slightly shifted in phase so that their trailing edge occurs prior to the conductive half cycle and thus keep the thyristor biased off. Finally, pulses $E_5$ and $E_6$ which occur in the third full cycle of AC, have their trailing ends in phase such that are within conductive half cycles and turn the thyristor on. Hence a cycling at this rate would provide half the power as compared with continuous triggering as shown in FIGURE 4B or 4C. It should be understood of course that the motor driven potentiometer 14 would provide a continuous cycling hence there would be a slight phase difference from one gate pulse to the next, however, for purposes of illustration the phase shift of both pulses of each full cycle are shown to be approximately equal.

Consequently, a turning "on" of the thyristor, by either of the means previously described, will result in a proportional amount of power being delivered to the load depending upon how far the pulse trailing edge is moved towards or into the conductive half-cycle. Thus, the average power delivered to the load depends upon a combination of the sensor value and the cycling, whereas the peak voltage and current delivered is always that of source 12. Similarly, by cycling the voltage amplitude to phase shifter 6, or primary winding 4, a proportional control may be also achieved. In the latter case, pulses B, C and D of FIGURE 4 are stationary in phase but cycled in length.

A further embodiment, in which the sensor is isolated from source 12, is shown in FIGURE 5. The circuit is generally similar to that of FIGURE 1. For example, transformer 50 is identical to transformer 2 of the latter with, however, two additional windings 52, 54. Similarly, although phase shifter 56 provides the additional refinement of compensation resistor 58, which shunts capacitor 18, it is analogous to phase shifter 6 of FIGURE 1.

As indicated, the circuit of FIGURE 5 functions in a manner similar to that of FIGURE 1. For example, the output of phase shifter 56 is made to lead the AC input 12 by approximately 45° and sensor 16 varies the voltage amplitude across winding 4 to provide similar, but isolated, control of the firing of thyristors 62, 66. Sensor 16, which is isolated in this case from source 12 or ground, is connected across winding 52 to provide a voltage response which is reflected back to winding 4 in response to environment 72.

A further modification is also incorporated in gate circuits 60, 64. These, although similar to 10, 10', are not approximately equal in impedance, since circuit 60 is provided with a slightly lower impedance to fire thyristor 62 first, and by its conduction through winding 54 to insure the firing of thyristor 66.

Consequently, gate circuits 60, 64 are similar to 10, 10' and have several components identical to those of the latter, however, resistor 68 is approximately twice that of resistor 26', so that the gate pulse across 26' will be elongated and thus insure that thyristor 62 is fired first. In addition, resistor 28, while the same as that of circuit 10 of FIGURE 1, is slightly greater than resistor 70.

This difference of impedance in conjunction with winding 54, slaves thyristor 66 to the firing of thyristor 62. Thus, network 60 having a lower impedance fires thyristor 62 first and thus passes current through winding 54. The direction of winding of 54 is such that when the energy is released (when conduction of thyristor 62 ceases at the start of the next half-cycle), it supplements the induced voltage of winding 8 and fires thyristor 66. In this manner, firing of both thyristors 62, 66 will be insured at any time that sensor 16 permits the firing of thyristor 62.

Since the firing circuit is voltage sensitive, and actually voltage controlled in some embodiments, the circuit may be employed to indicate or control variations in source voltage. For example, any change in amplitude of source voltage 12 will provide a shift of the pulse fall and thus an on-off control of the thyristor which may be employed to indicate, or control, the voltage change.

Consequently, for general use a stable AC source is desirable, however, a compensation for normal variations in voltage can be provided by a voltage sensitive shunt or varistor 58 in parallel with capacitor 18, as shown in FIGURE 5. The varistor 58 is chosen to have a proper value of negative voltage coefficient, that is decreasing resistance with increasing voltage, to compensate for deviations in source voltage amplitude.

When source voltage 12 increases, the voltage amplitude across each element of the phase shift network 56 increases proportionately and the firing pulse is shortened, thereby moving the trailing edge back, since transformer 50 is saturated earlier. A proportionate increase in voltage, however, is also impressed across the parallel branch of capacitor 18 and varistor 58. This increase of voltage causes a lower resistance of varistor 58 and a reduction in length of the vector E18 of FIGURE 3. This lengthens the E14, E16 vector and reduces the phase angle $\theta$, thus reducing the phase lead with respect to source 12. In this way the shortening of the pulse and the move back of the trailing edge, due to the increase in voltage amplitude, is compensated for by a phase shift toward the conducting half-cycle.

Proportional control may, of course, also be employed in the circuit of FIGURE 5. The same means of cycling the pulse in length or phase would be suitable. It should be understood, however, the varistor 58 could not be employed with amplitude cycling of the phase shifter input since it compensates for the latter.

Advantageously, many different types of sensors may be used in the described circuit, depending upon the environment characteristic and the precise control, or sensitivity, desired. For example in FIGURE 5, sensor 16 may be a thermally sensitive device, such as a positive temperature coefficient thermistor or the like, which controls the temperature of the environment in an area 72 surrounding an electric heating element 74. The desired temperature of the environment 72 is fixed by adjusting potentiometer 14 to set the phase of the voltage across winding 4 such that, at the desired temperature, the pulse fall or trailing edge is just within a half-cycle of similar polarity. Then any further increase in temperature results in increased sensor resistance, followed by increased voltage across windings 4, and a subsequent shortening of the pulse which turns "off" the thyristors. Conversely, a subsequent decrease in temperature will cause a lowering of voltage across winding 4, an elongation of the pulse and a turning "on" of the thyristors. As noted earlier, the switching always takes place at or very close to the zero crossing of the alternating current so that the firing, or environmental control, is low in noise.

A circuit constructed in accordance with FIGURE 5, and with the circuit parameters listed below, exhibited a thermal sensitivity within one degree centigrade. The following typical circuit parameters were used:

| | |
|---|---|
| A.C. source 12 | 110 volts. |
| Potentiometer 14 | 6,000 ohms. |
| Sensor 16 | 5,000 to 10,000 ohms at operating temperature. |
| Capacitor 18 | 0.39 mfd. |
| Varistor 58 | 90,000 ohms at 90 volts. |
| Diodes 24, 24' | 25 volt, 50 ma. |
| Resistor 26' | 510 ohms. |
| Resistor 28 | 100 ohms. |
| Resistor 68 | 1,000 ohms. |
| Resistor 70 | 82 ohms. |
| Transformer 50 | 800T:800T:200:200 with added single turn on a Dynacore D572x1–40 core. |

Depending upon the environment, various types of sensors may be suitable. For example, devices sensitive to light, moisture, vibration, etc., may be employed.

Control means, such as switches etc. are also suitable. For example, a thermal switch could be utilized or a manually operated switch would also be suitable. In such cases, a resistance in series with the switch would be required for satisfactory operation.

Figure 6:
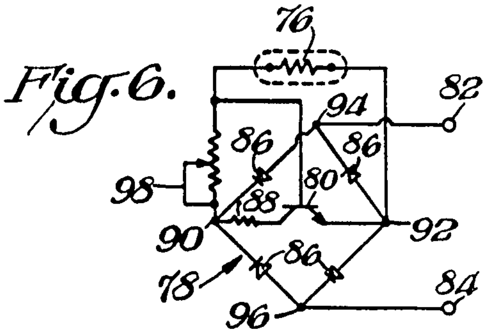
FIGURE 6 is a schematic diagram of a voltage inverting network for use with negative coefficient sensors.

It should be understood, however, that if a negative temperature coefficient device or NTC sensor, were employed to vary the voltage on winding 4, it would generally be necessary to invert the sensor response. One means of inverting the sensor response is shown in FIGURE 6. Herein a negative temperature coefficient thermistor 76 or the like is employed in combination with a rectifying bridge circuit 78 and a transistor 80 to provide a response of correct polarity at terminal points 82, 84 which correspond to similar terminals of FIGURES 1 and 5. The NTC sensor 76 is connected between the base and emitter of transistor 80 so that it cuts off at high temperatures and in turn provides a high resistance across points 82, 84, higher voltage on winding 4, and a turning "off" of the thyristors.

Bridge 78 is made up of four rectifiers or diodes 86 similar to 24, 24'. A 1.5 K resistor 88 connects the collector of transistor 80 to one side 90 of bridge 78 while emitter is connected to the opposite terminal 92. The remaining bridge terminals 94, 96 are connected directly to circuit terminals 82, 84. Sensor 78 is joined at one end to the transistor emitter at terminal 92. The other end is connected to the base transistor 80 and through a 50 kilohm potentiometer 98 to bridge terminal 90.

Potentiometer 98 provides a further temperature adjustment in the circuit and would allow potentiometer 14 to be a fixed resistor. As indicated, this circuit will provide a positive voltage response on winding 4 with an NTC sensor.

It can be appreciated that inductive environmental loads, which do not have the zero degree power factor of resistive loads, require some modification for use with the described circuit, since the current through the load and thus through the thyristors will lag the source. This difficulty can be alleviated however, by adding a capacitive element to the load to make its power factor zero degrees.

Thus, although the invention has been described with reference to a particular circuit configuration, it should be understood that many different modifications may be made without departing from the spirit and scope hereof and that the invention is not to be limited except as defined in the appended claims.

What is claimed is:

1. A low noise control circuit comprising at least one thyristor having its cathode and anode in connection to an electrical load and an alternating current source and its gate in connection to a gate circuit which provides a pulse leading the source in phase, and said gate circuit includes means for elongating said pulse to shift the position of its trailing edge around the zero crossing of A.C. half-cycles having the same polarity as said pulse and to move said trailing edge in and out of said half-cycles and providing a firing of said thyistor only at their commencement.

2. A circuit as claimed in claim 1 wherein said gate circuit provides a fast fall time pulse having a steep trailing edge and a pulse width slightly less than the leading phase angle so that the trailing edge occurs at or just prior to said zero crossing which thereby provides a highly sensitive circuit requiring only slight elongation of said pulse for firing of said thyristor.

3. A circuit as claimed in claim 1 including input cycling means providing a cyclic variation in said trailing edge occurrence and proportional control of said firing.

4. A circuit as claimed in claim 1 wherein said load is environment producing, and said means for elongating said pulse is a sensor which is responsive to said produced environment and varies said pulse length to move said trailing edge into and back out of said half-cycle and fire said thyristor in accordance with a fixed environmental value.

5. A circuit as claimed in claim 4 wherein said gate circuit comprises a square loop core transformer having a phase shifting means connecting said source thereto and providing an input voltage leading said source, and said sensor is coupled to said transformer and provides an amplitude variation in the input thereof which varies said pulse length.

6. A circuit as claimed in claim 1 wherein said gate circuit comprises a square loop core transformer having its input coupled to said source through a phase shifting means which provides a transformer input voltage leading said source, and said transformer having its output coupled to said gate for delivering said pulse thereto.

7. A circuit as claimed in claim 6 wherein said phase shifting means comprises a resistor connecting one side and a capacitor connecting the other side of the primary of said transformer to said source.

8. A circuit as claimed in claim 7 including a voltage sensitive resistor of negative voltage coefficient in parallel connection with said capacitor for providing a phase variation to said transformer input in compensation for amplitude variations of said source.

9. A circuit as claimed in claim 6 wherein said means for elongating said pulse is a sensor coupled to the input of said transformer and providing an amplitude variation in input voltage thereto.

10. A circuit as claimed in claim 9 including a voltage compensating means providing a variation in phase of said transformer input to compensate for amplitude variations of source voltage.

11. A circuit as claimed in claim 9 wherein said sensor is a resistor having a positive coefficient of resistance.

12. A circuit as claimed in claim 9 including a voltage inverting network coupling said sensor to said transformer, and said sensor is a resistor having a negative coefficient of resistance.

13. A circuit as claimed in claim 9 wherein said sensor is coupled to said transformer input by a separate transformer winding which is electrically isolated from said source and said transformer input.

References Cited

UNITED STATES PATENTS

| | | | |
|---|---|---|---|
| 3,283,177 | 11/1966 | Cooper | 307—133 X |
| 3,335,291 | 8/1967 | Gutzwiller | 307—252 |
| 3,351,820 | 11/1967 | Balint | 307—136 X |
| 3,095,513 | 6/1963 | Lezan | 323—119 X |
| 3,128,422 | 4/1964 | Brown | 323—122 X |
| 3,188,490 | 6/1965 | Hoff et al. | |
| 3,193,725 | 7/1965 | Skirpan | 323—22 X |
| 3,210,571 | 10/1965 | Hutson | 323—24 |
| 3,259,832 | 7/1966 | Summerer | 323—22 X |
| 3,348,129 | 10/1967 | Schonholzer | 323—22 |

OTHER REFERENCES

Silicon controlled rectifier manual, General Electric Rectifier Components Dept., Auburn, N.Y., third edition, 1964, p. 53.

JOHN F. COUCH, *Primary Examiner.*

A. D. PELLINEN, *Assistant Examiner.*

U.S. Cl. X.R.

323—36; 307—133, 252, 265